US008072832B2

(12) United States Patent
Agata et al.

(10) Patent No.: US 8,072,832 B2
(45) Date of Patent: Dec. 6, 2011

(54) ELECTRONIC EQUIPMENT SYSTEM AND SEMICONDUCTOR INTEGRATED CIRCUIT CONTROLLER

(75) Inventors: Yasuhiro Agata, Osaka (JP); Yutaka Terada, Osaka (JP); Kenji Misumi, Kyoto (JP); Masanori Shirahama, Shiga (JP); Mitsuaki Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/888,158

(22) Filed: Sep. 22, 2010

(65) Prior Publication Data
US 2011/0007595 A1   Jan. 13, 2011

Related U.S. Application Data

(63) Continuation of application No. PCT/JP2009/000858, filed on Feb. 26, 2009.

(30) Foreign Application Priority Data

May 13, 2008   (JP) ................................. 2008-125678

(51) Int. Cl.
*G11C 17/16* (2006.01)
(52) U.S. Cl. ................................. 365/225.7; 365/230.03
(58) Field of Classification Search ............... 365/225.7, 365/230.03
See application file for complete search history.

(56) References Cited

U.S. PATENT DOCUMENTS

| 5,446,505 | A | 8/1995 | Chang Soo et al. |
| 6,377,251 | B1 | 4/2002 | Takasu et al. |
| 6,401,179 | B1 * | 6/2002 | Park .............................. 711/165 |
| 2003/0016574 | A1 | 1/2003 | Hachiya |
| 2007/0003058 | A1 | 1/2007 | Fujiwara et al. |
| 2007/0012979 | A1 * | 1/2007 | Song et al. .................... 257/296 |
| 2008/0088356 | A1 | 4/2008 | Inada et al. |

FOREIGN PATENT DOCUMENTS

| JP | 2002-042472 | 2/2002 |
| JP | 2002-190196 | 7/2002 |
| JP | 2003-023349 | 1/2003 |
| JP | 2003-115189 | 4/2003 |
| JP | 2006-120686 | 5/2006 |
| JP | 2007-11871 | 1/2007 |
| WO | WO 2009/008151 A1 | 1/2009 |

* cited by examiner

*Primary Examiner* — Michael Tran
(74) *Attorney, Agent, or Firm* — McDermott Will & Emery LLP

(57) ABSTRACT

An electronic equipment system includes a semiconductor integrated circuit having a nonvolatile memory storing information on a characteristic of the semiconductor integrated circuit; and a controller configured to control the semiconductor integrated circuit. The controller has a function of adjusting an access parameter to the semiconductor integrated circuit based on the information stored in the nonvolatile memory.

16 Claims, 6 Drawing Sheets

ELECTRONIC EQUIPMENT SYSTEM AND SEMICONDUCTOR INTEGRATED CIRCUIT CONTROLLER

CROSS-REFERENCE TO RELATED APPLICATION

This is a continuation of PCT International Application PCT/JP2009/000858 filed on Feb. 26, 2009, which claims priority to Japanese Patent Application No. 2008-125678 filed on May 13, 2008. The disclosures of these applications including the specifications, the drawings, and the claims are hereby incorporated by reference in their entirety.

BACKGROUND

The present disclosure relates to an electronic equipment system having a large-scale integration (LSI) such as a system LSI (semiconductor integrated circuit), and more particularly to an electronic equipment system in which adjustment against fabrication variations of the LSI, for example, is possible.

Conventionally, in order to improve the performance of LSIs to meet specifications required for electronic equipment systems, techniques of adjusting circuit characteristics of the inside of the LSIs using anti-fuses and fuses have been actively used (see Japanese Patent Publication No. 2002-42472 (Patent Document 1), for example). Specifically, Patent Document 1 describes techniques of adjusting the input capacitance of an input terminal, the phase of an internal clock, and the refresh cycle of a DRAM, as circuit characteristics of the inside of LSIs, using anti-fuses. In such an LSI, when the input capacitance exceeds a specified range in a testing process, for example, an anti-fuse can be programmed to hold information for adjusting the input capacitance. At power-up of the LSI, the circuit path can be changed based on the information held in the anti-fuse, so that the input capacitance can be adjusted. With this adjustment, in actual use of the LSI, the input capacitance is allowed to fall within a predetermined specified range at any time, and thus fabrication variations can be easily addressed. The DRAM refresh cycle and the like can also be adjusted in similar ways: that is, a circuit characteristic of the inside of an LSI can be adjusted by programming an anti-fuse so that the characteristic falls within its specified range in a testing process of the LSI.

SUMMARY

The inventors of the present invention have found that the techniques of adjusting circuit characteristics based on information held in anti-fuses as described above have the following problems. Since it is necessary to configure an LSI so that characteristics of its inner circuits are adjustable, the hardware scale of the LSI increases. Moreover, only a limited number of characteristics are adjustable, and high-precision adjustment is not necessarily easy. For example, with the recent enhancement in the performance of system LSIs, it is increasingly becoming difficult to fabricate high-performance system LSIs, which can satisfy required specifications against fabrication variations by themselves, stably with high yield To overcome the problem described above, an example electronic equipment system of the present invention includes: a semiconductor integrated circuit having a non-volatile memory storing information on a characteristic of the semiconductor integrated circuit; and a controller configured to control the semiconductor integrated circuit, wherein the controller has a function of adjusting an access parameter to the semiconductor integrated circuit based on the information stored in the nonvolatile memory.

In the electronic equipment system described above, the function of the controller of adjusting an access parameter to the semiconductor integrated circuit may be a function of adjusting an electric characteristic of a signal or a voltage supplied to the semiconductor integrated circuit or another semiconductor integrated circuit operating in coordination with the semiconductor integrated circuit based on the information stored in the nonvolatile memory.

With the above configuration, a circuit characteristic of the semiconductor integrated circuit is adjusted by the controller based on the information stored in the nonvolatile memory of the semiconductor integrated circuit. Alternatively, not the circuit characteristic itself of the semiconductor integrated circuit, but an electric characteristic of a signal or a voltage supplied to the semiconductor integrated circuit is adjusted.

Therefore, electric characteristics, such as the duty ratio of the clock signal and the power supply voltage, which are difficult to adjust because it is impossible or difficult to provide an adjustment circuit in the semiconductor integrated circuit under constraints such as the circuit scale, the fabrication cost, and the adjustment precision, can be adjusted easily by the controller that is free from such constraints.

According to the present invention, an appropriate signal or voltage allowing for variations during fabrication of a semiconductor integrated circuit can be supplied to the semiconductor integrated circuit. This makes it possible to enhance the reliability of the semiconductor integrated circuit and reduce the power consumption easily while suppressing increase in the circuit scale of the semiconductor integrated circuit, for example.

DETAILED DESCRIPTION

Figure 1:
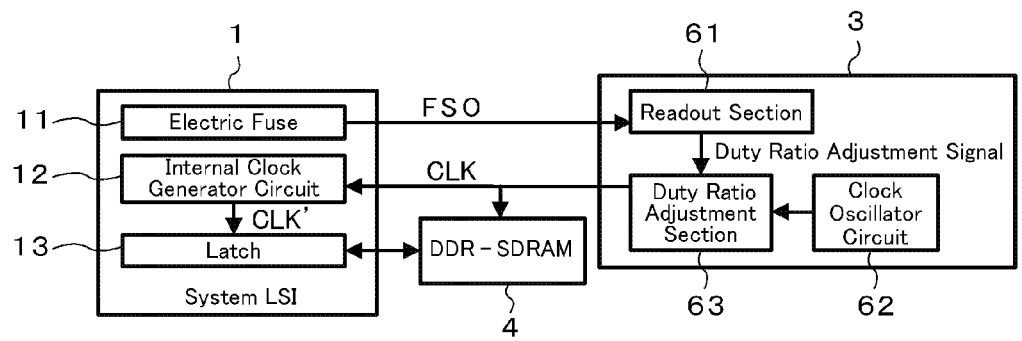
FIG. 1 is a block diagram of an electronic equipment system of the first embodiment.

Embodiments of the present invention will be described in detail with reference to the accompanying drawings. Note that, in the embodiments to follow, components having the same or similar functions are denoted by the same reference numerals and description of such components is omitted as appropriate.

First Embodiment (Configuration of Electronic Equipment System)

As the first embodiment of the present invention, an electronic equipment system will be described, which is provided with a system LSI (semiconductor integrated circuit) including a plurality of logic circuit modules and a controller for supplying a clock signal to the system LSI. In this embodiment, as an example, a latch circuit of the system LSI is assumed to be a circuit whose operation is affected by the duty ratio of the clock signal.

More specifically, as shown in FIG. 1, for example, the electronic equipment system includes: a system LSI 1; a double data rate synchronous dynamic random access memory (DDR-SDRAM) 4 from/into which data is read/written by the system LSI 1; and a controller 3 for controlling the system LSI 1 and the DDR-SDRAM 4. Such an electronic equipment system is used for TV receivers and the like, for example.

The system LSI has an electric fuse 11 built therein, and also includes an internal clock generator circuit 12 and a data input/output (I/O) latch circuit 13.

The electric fuse 11 stores duty ratio information indicating the duty ratio a data strobe clock signal CLK supplied to the system LSI 1 should have (optimum value of an access parameter).

Figure 2:
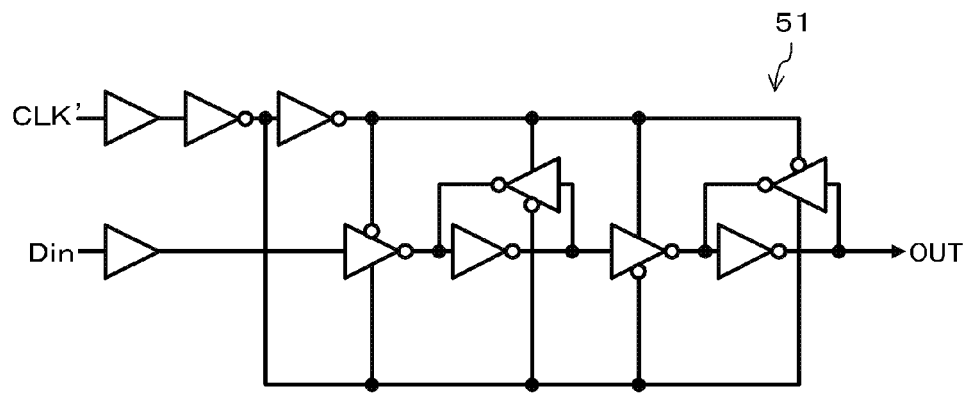
FIG. 2 is a circuit diagram showing a configuration of a flipflop circuit 51 in the first embodiment.

The data I/O latch circuit 13, serving as an interface for the DDR-SDRAM 4, holds data written into and read from the DDR-SDRAM 4 temporarily. Specifically, the data I/O latch circuit 13 is constructed of flipflop circuits 51, each made of inverters and 3-state inverters as shown in FIG. 2, by the number equivalent to the number of bits of data.

The internal clock generator circuit 12 multiplies the 400-MHz clock signal CLK supplied from the controller 3, to generate an internal clock signal CLK' having a double frequency (800 MHz) rising in synchronization with every rising edge and falling edge of the clock signal CLK, and supplies the generated clock to the data I/O latch circuit 13. In this way, data transfer to/from the DDR-SDRAM 4 is performed in synchronization with both the rising and falling edges of the clock signal CLK (at a double transfer rate).

The controller 3 for controlling the system LSI 1 includes a readout section 61, a clock oscillator circuit 62, and a duty ratio adjustment section 63.

The readout section 61 reads the duty ratio information stored in the electric fuse 11 of the system LSI 1 (FSO), and also serves as an adjustment section that outputs a duty ratio adjustment signal for controlling the duty ratio adjustment section 63 based on the duty ratio information. As such a readout section 61, a processor, for example, may be used, which may execute software to read the duty ratio information from the electric fuse 11 and output the duty ratio adjustment signal. Alternatively, the duty ratio information may be read by hardware, or the duty ratio information may be acquired by communication with the system LSI 1. As the duty ratio adjustment signal, the read duty ratio information may be output as it is, or may be output after being subjected to decoding and computation. When a range of permissible values of the duty ratio or a value such as the lower-limit value or upper-limit value of the duty ratio, not the optimum value, is stored as the duty ratio information, the median value of the range may be determined, or a value also considering another condition may be determined.

The duty ratio adjustment section 63 adjusts the duty ratio (e.g., the phase of at least either the rising edge or the falling edge) of the clock signal oscillated by the clock oscillator circuit 62 according to the duty ratio adjustment signal, and outputs the result to the system LSI 1 and the DDR-SDRAM 4 as the clock signal CLK. How to adjust the duty ratio is not particularly specified, but any of various known techniques can be used. For example, the input clock signal and its delayed signal may be combined by an AND circuit or an OR circuit, and the delay amount may be changed according to the duty ratio adjustment signal. Otherwise, the drive capability of an n-type metal oxide semiconductor (MOS) transistor and/or a p-type MOS transistor constituting a complementary MOS (CMOS) circuit provided in the duty ratio adjustment section 63 may be changed, to shift the phase of the edges of the clock signal.

(Duty Ratio of Clock Signal)

The duty ratio of the clock signal CLK and the period of the internal clock signal CLK' will be described.

First, described will be the case that the duty ratio of the clock signal CLK is accurately 50% and the thresholds of transistors constituting the internal clock generator circuit 12 and other factors are appropriate. In this case, the period of the internal clock signal CLK' is accurately a half of the period of the clock signal CLK. That is, the margin in each cycle of the internal clock signal CLK' is even and largest.

Figure 3:
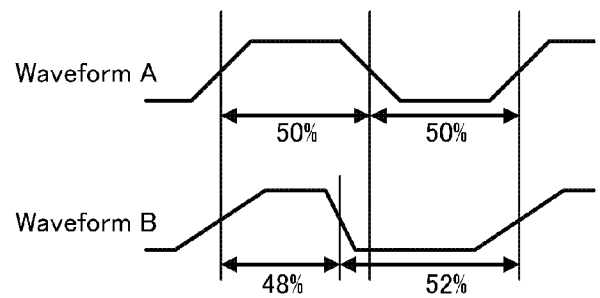
FIG. 3 is a view illustrating an example of deviation of the duty ratio of a clock signal.

However, even though the duty ratio of the clock signal CLK is accurately 50%, if the threshold of a transistor varies in the fabrication process, the period of the internal clock signal CLK' will vary. For example, if an input buffer of the internal clock generator circuit 12 has been fabricated with the threshold Vt of its n-type MOS transistor being lower than a predetermined standard value and the absolute value |Vt| of the threshold Vt of its p-type MOS transistor being higher than a predetermined standard value, the output of the input buffer will be slow in rising and fast in falling. In this state, when a clock signal having a duty ratio of 50% as shown by waveform A in FIG. 3, for example, is input into the input buffer, the duty ratio of the output clock signal will be small like 48% as shown by waveform B. In this case, the period of the internal clock signal CLK' corresponding to the duration for which the clock signal CLK is high will be short, while the period thereof corresponding to the duration for which the clock signal CLK is low will be long. That is, the minimum margin of holding timing of data will be small, increasing the possibility that the data may not be held correctly.

(Testing of System LSI 1)

In consideration of the above, in the electronic equipment system of this embodiment, the duty ratio of the clock signal CLK input into the internal clock generator circuit 12 is shifted from 50% in advance according to variations in the thresholds of transistors and the like, whereby finally the period of the internal clock signal CLK' becomes stable. How much the duty ratio should be shifted, that is, the duty ratio the clock signal CLK supplied to the system LSI 1 should have, is determined by a test as follows performed during fabrication of the system LSI 1, for example, and stored in the electric fuse 11 of the system LSI 1 as the duty ratio information.

Figure 4:
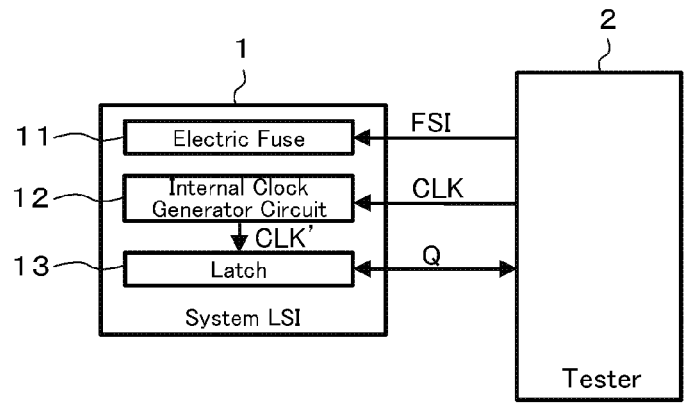
FIG. 4 is a block diagram showing a way of testing a system LSI 1 used in the electronic equipment system of the first embodiment.

The test is performed by connecting a tester 2 to the system LSI 1 as shown in FIG. 4, for example. While supplying the clock signal CLK to the system LSI 1, the tester 2 writes test data Q into the data I/O latch circuit 13 and then reads the written data therefrom, to determine whether the written data and the read data match with each other, that is, whether the write and the readout have been performed properly. The test as described above is repeated while sequentially changing the duty ratio of the clock signal CLK supplied to the system LSI 1 (scanning), to determine the range of values of the duty ratio within which the test is passed and the range thereof within which the test fails.

Figure 5:
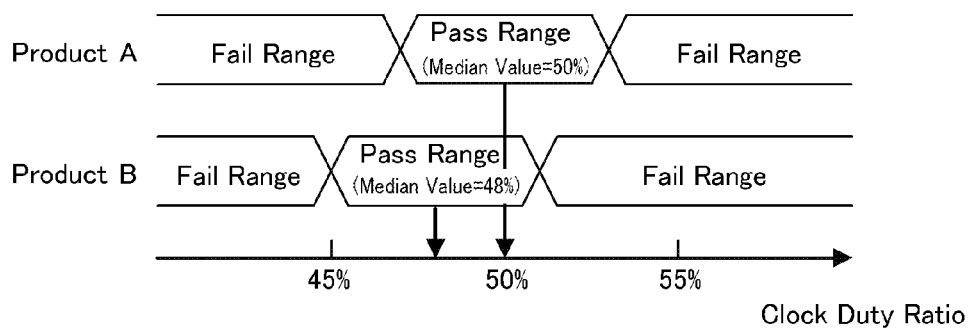
FIG. 5 is a view illustrating examples of test results of the system LSI 1 in the first embodiment.

The ranges described above are not necessarily the same due to variations during fabrication of the system LSI 1, as shown by products A and B in FIG. 5, for example. The tester 2 determines the median value of the range of values of the duty ratio within which the test is passed, for example, and stores the resultant value in the electric fuse 11 as the duty ratio information (FSI). More specifically, the duty ratio information indicating that the duty ratio is 50% for product A, or 48% for product B, is stored in the electric fuse 11.

For high-precision testing, the test described above should preferably be performed for the system LSI 1 in its packaged state, that is, the system LSI 1 when shipped in the final form. Moreover, the system LSI 1 may be mounted temporarily on a printed wiring board having the same wiring pattern as, or a similar wiring pattern to, that of the printed wiring board (system board) on which the system LSI 1 is actually mounted, and tested. In this case, since delays at the propagation of the clock signal CLK and the test data Q through the wiring pattern of the printed wiring board, for example, are close to those in the actual use state, higher-precision testing can be performed easily. Therefore, for a variety of wiring patterns on printed wiring boards and the like and a variety of mounting patterns, a clock signal CLK having a duty ratio corresponding to each of such wiring patterns can be supplied. This makes it possible to improve the degree of freedom of design of printed wiring boards and the like and thus improve the productivity easily.

Alternatively, the test may be performed at the maximum temperature, the minimum temperature, the intermediate temperature, and the like within a specified temperature range, and a duty ratio with which the test is passed at any of the temperatures may be determined.

Otherwise, the test may be performed in an operation state in which a circuit load similar to that during actual use is imposed. Also, in the case where the operation of the system LSI when mounted in an electronic equipment system has a load higher than the operation thereof during the testing process (i.e., in the case where a number of logic circuit modules in the system LSI operate simultaneously), the test may be performed at a temperature high enough to limit the speed performance of the system LSI 1, such as a temperature higher than the maximum working temperature defined as a specification condition, for example, thereby to simulate such a high-load state.

If the range of the duty ratio within which the test is passed is narrowed by the testing condition as described above compared with that during actual use, test results having large margins for the upper and lower limits will be obtained.

(Operation of System LSI 1 During Use)

The electronic equipment system having the system LSI 1 in which duty ratio information is stored in the electric fuse 11 operates as follows at its power-up, for example. First, the readout section 61 of the controller 3 reads the duty ratio information stored in the electric fuse 11 of the system LSI 1 (FSO), and outputs the duty ratio adjustment signal to the duty ratio adjustment section 63. The duty ratio adjustment section 63 adjusts the duty ratio of the clock signal (e.g., frequency: 400 MHz, duty ratio: 50%) oscillated by the clock oscillator circuit 62 according to the duty ratio adjustment signal, to output a clock signal CLK having a duty ratio of 48% to the system LSI 1 in the case of product B described above, for example.

In the system LSI 1, having received the clock signal CLK having a duty ratio of 48%, the input buffer of the internal clock generator circuit 12, for example, outputs a clock signal having a duty ratio of 50% due to variations in the threshold Vt of transistors constituting the input buffer. The internal clock generator circuit 12 then multiplies the clock signal, to output an internal clock signal CLK' having a frequency of 800 MHz and a constant period. Receiving such a clock, the data I/O latch circuit 13 can hold data to be input into and output from the DDR-SDRAM 4 at appropriate timing.

Figure 6:
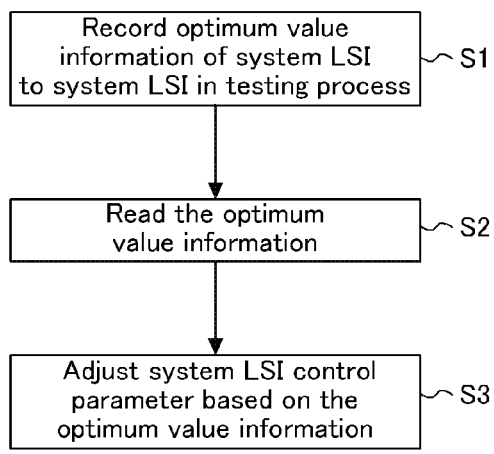
FIG. 6 is a flowchart showing testing and operation of the system LSI 1 in the first embodiment.

FIG. 6 is a flowchart showing the test described above and the operation of the system LSI 1 when being used. First, in the testing process, optimum value information on an access parameter is detected from the individual difference due to fabrication variations in the threshold of transistors of the system LSI 1, and is recorded in a nonvolatile memory in the system LSI 1 (S1). Thereafter, at power-up of the electronic equipment system having the system LSI 1, the optimum value information recorded in the system LSI 1 is read by the controller 3 (S2). Based on the optimum value information, the access parameter to the system LSI 1 in the controller 3 is adjusted (S3). In other words, the duty ratio of the clock signal CLK supplied to the system LSI 1 is adjusted. In this way, a clock signal CLK having a duty ratio optimum for the system LSI 1, which has been detected in the testing process, can be reproduced on the electronic equipment system.

As described above, it is possible to implement an electronic equipment system on which the duty ratio of the clock signal CLK optimum for the system LSI 1 and the interface portion of the DDR-SDRAM 4 is reproduced. Thus, an electronic equipment system high in the reliability of data transfer with respect to the operation of the DDR-SDRAM interface portion can be provided.

In other words, it is easily possible to operate the electronic equipment system properly considering variations in the fabrication of the system LSI 1 and the like while suppressing the circuit scale of the system LSI 1 from increasing.

(Variations)

In the above description, the clock signal CLK was input into the combined circuit of the internal clock generator circuit 12 and the data I/O latch circuit 13 of the system LSI 1. This is a mere example of this embodiment, and a similar effect can also be obtained for any circuit whose operation is affected by the duty ratio of the clock signal CLK input externally and which has the possibility that the duty ratio appropriate to the circuit may vary with the system LSI 1 to which the circuit belongs.

That is, instead of the internal clock generator circuit 12 having the multiplication function, a circuit merely meant for buffering may be provided. Alternatively, the internal clock generator circuit 12 may not necessarily be provided, and the clock signal CLK may be directly input into the data I/O latch circuit 13 or the like. Such a configuration also applies as far as the data I/O latch circuit 13 or the like is a circuit whose operation is affected by the duty ratio of the clock signal CLK.

Another example of such a circuit is a circuit having a latch function and serving as an interface for the DDR-SDRAM 4, like the data I/O latch circuit 13, as far as it operates as described above based on a clock signal and the operation of the circuit is affected by the duty ratio. In other words, the circuit may not necessarily be a circuit having a latch function, a circuit connected to another LSI, or a circuit that is connected to another LSI into which the same clock signal CLK as that input into the system LSI 1 is input.

Figure 7:
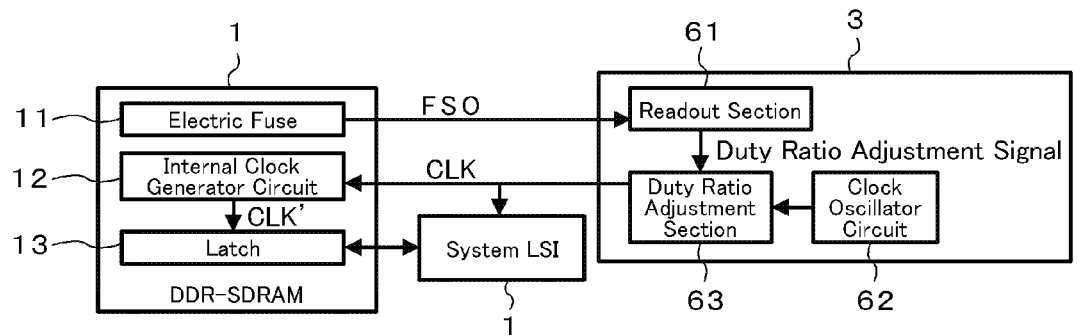
FIG. 7 is a block diagram of an electronic equipment system of a variation of the first embodiment.

The system LSI 1 was described as an example of the semiconductor integrated circuit to which the clock signal CLK was supplied. The present invention is not limited to this, but is applicable to a variety of semiconductor integrated circuits. Specifically, as shown in FIG. 7, for example, the duty ratio of the clock signal CLK supplied to a DDR-SDRAM 4 having an electric fuse 11, an internal clock generator circuit 12, and a data I/O latch circuit 13 may be controlled by a controller 3.

In the example described above, the electric fuse 11 was used as the memory circuit for the duty ratio information. The type of the memory circuit is not especially limited as far as it is a nonvolatile memory mountable in the system LSI 1. For example, an antifuse and the like produced by an advanced process may be used, or a rewritable element and the like may be used.

Second Embodiment

The duty ratio may be controlled based on duty ratio information stored in a plurality of LSIs.

Figure 8:
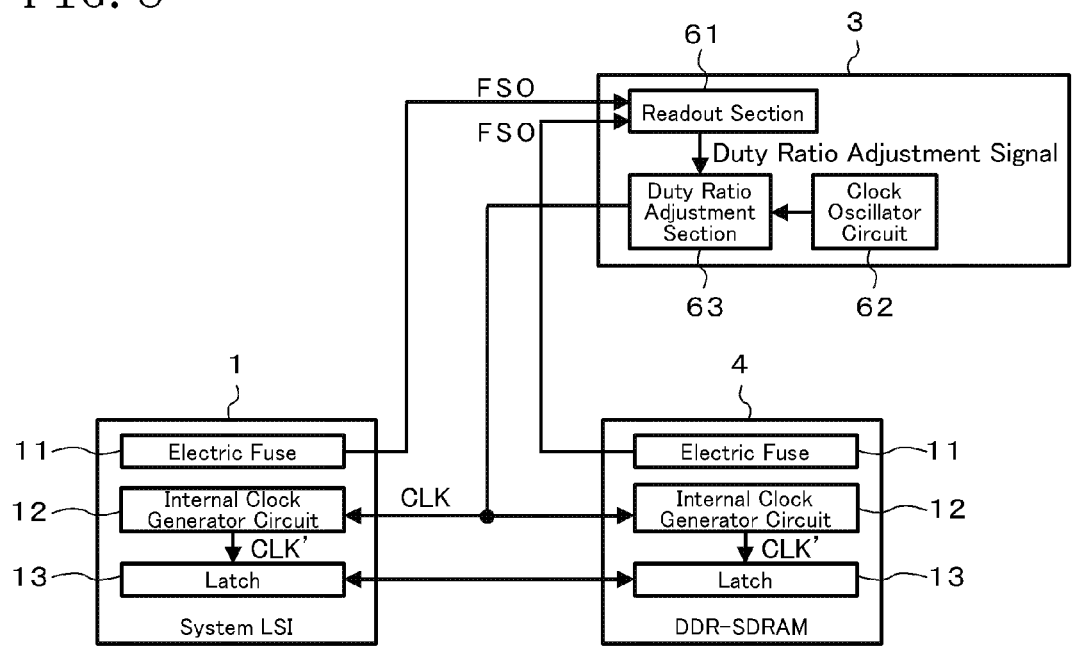
FIG. 8 is a block diagram of an electronic equipment system of the second embodiment.

As shown in FIG. 8, an electronic equipment system of the second embodiment includes a system LSI 1 and a DDR-SDRAM 4, each having an electric fuse 11, as described with reference to FIGS. 1 and 7, respectively. A readout section 61 of a controller 3 reads duty ratio information stored in the two electric fuses 11, to control a duty ratio adjustment section 63.

More specifically, the readout section 61 determines the average value of the optimum values of the duty ratio stored in the electric fuses 11 of the system LSI 1 and the DDR-SDRAM 4, to control the duty ratio adjustment section 63 so that the clock signal CLK having the resultant duty ratio is output. When information such as the range of values of the duty ratio, or the lower-limit or upper-limit value of the duty ratio, which can be supplied, is stored in the electric fuses 11, a value in the overlapping range, or the median value of the overlapping range, for example, may be determined to be used as the duty ratio of the clock signal CLK. When it is unnecessary to supply the same clock signal to the system LSI 1 and the DDR-SDRAM 4, a plurality of duty ratio adjustment sections 63 may be provided to supply clock signals CLK having duty ratios optimum for the individual LSIs.

Third Embodiment

In this embodiment, described will be an electronic equipment system in which the power supply voltage supplied to a system LSI is adjusted to allow the system LSI to operate properly and also suppress the power consumption from increasing.

(Configuration of Electronic Equipment System)

Figure 9:
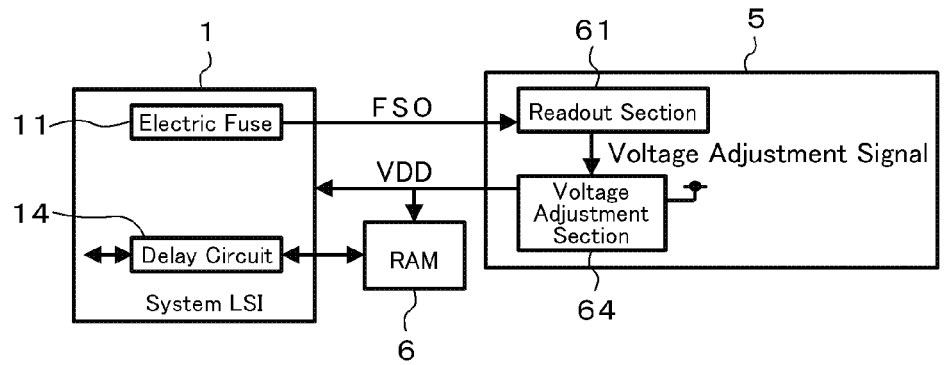
FIG. 9 is a block diagram of an electronic equipment system of the third embodiment.

As shown in FIG. 9, for example, the electronic equipment system of the third embodiment includes: a system LSI 1 including a plurality of logic circuit modules; a RAM 6 from/into which data is read/written by the system LSI 1; and a regulator (controller) 5 for supplying the power supply voltage VDD to the system LSI 1 and the RAM 6.

The system LSI 1 has an electric fuse 11 built therein. Power supply voltage information indicating the power supply voltage VDD to be supplied to the system LSI 1 (optimum value of an access parameter) is stored in the electric fuse 11.

The system LSI 1 also includes a delay circuit 14. It should be noted that the delay circuit 14 is depicted as a representative of a circuit through which a signal corresponding to data read/written from/into the RAM 6 propagates, and does not necessarily indicate that delaying a signal is necessary. It is herein described that the shorter the delay time of the delay circuit 14 is the better and that the upper limit of the permissible delay time has been defined as a performance requirement.

Figure 10:
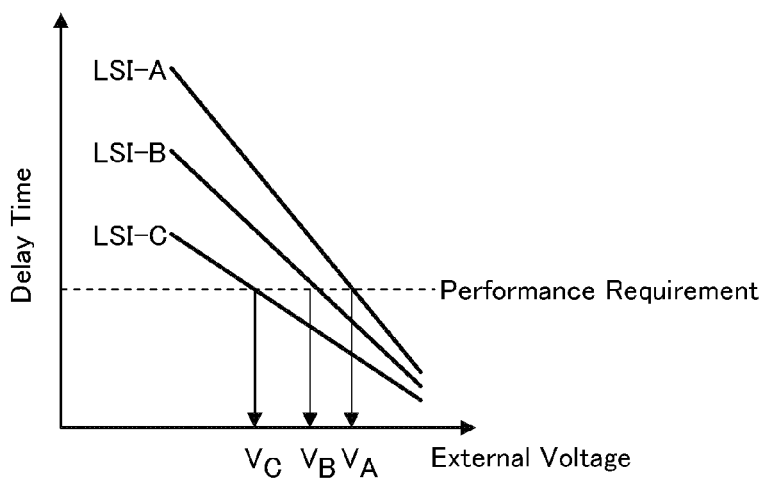
FIG. 10 is a view illustrating examples of the relationship between the power supply voltage and delay time of a delay circuit 14 of a system LSI 1 in the third embodiment.

For example, a circuit using MOS transistors is generally shorter in delay time as the power supply voltage is higher. Therefore, as shown in FIG. 10, as the power supply voltage VDD supplied from the regulator 5 is higher, the margin of the delay time of the delay circuit 14 is larger, although the power consumption is larger. Also, when variations occur in the threshold of transistors in the fabrication process, for example, the power supply voltage VDD required to suppress the delay time to the level of the performance requirement is not the same, as shown by $V_A$ to $V_c$ for three examples LSI-A to C in FIG. 10. To state more specifically, the higher the absolute value |Vt| is due to variations in the threshold Vt of transistors, the higher the necessary power supply voltage VDD is (LSI-A), while the lower the absolute value |Vt| is, the lower the necessary power supply voltage VDD is (LSI-C). In view of this, by supplying the power supply voltage VDD corresponding to the threshold Vt of each system LSI 1, it is possible to operate the system LSI 1 properly and also suppress the power consumption from increasing.

The regulator 5 for supplying the power supply voltage VDD to the system LSI 1 includes a readout section 61 and a voltage adjustment section 64 as shown in FIG. 9.

The readout section 61 operates in a manner similar to that described in the first embodiment, to output a voltage adjustment signal for controlling the voltage adjustment section 64.

The voltage adjustment section 64 adjusts the power supply voltage VDD supplied to the system LSI 1 and the RAM 6 according to the voltage adjustment signal.

(Testing of System LSI 1)

Figure 11:
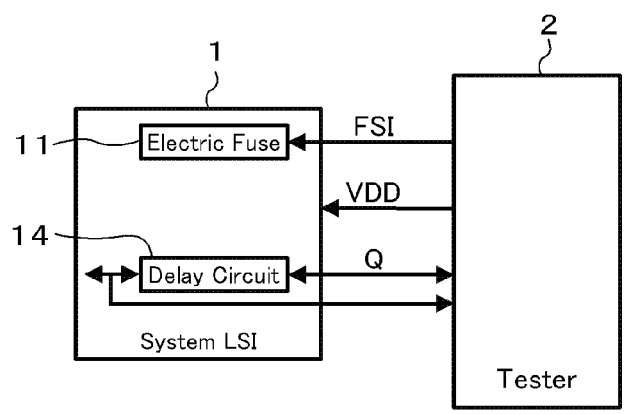
FIG. 11 is a block diagram showing a way of testing the system LSI 1 used in the electronic equipment system of the third embodiment.

The test of the system LSI 1 is performed by connecting a tester 2 to the system LSI 1 as shown in FIG. 11, for example. While supplying the power supply voltage VDD to the system LSI 1, the tester 2 outputs a test signal Q to the system LSI 1, to test the delay time of the delay circuit 14. To state more specifically, the tester 2 measures the time required for the signal input into the delay circuit 14 to propagate through and be output from the delay circuit 14, and, as necessary, determines whether the time is within a predetermined time. The test as described above is repeated while the power supply voltage VDD supplied to the system LSI 1 is sequentially varied, to determine the lowest power supply voltage VDD with which the delay time satisfying the performance requirement is obtained, and the power supply voltage information indicating the determined power supply voltage, or a voltage with a given allowance added to the determined power supply voltage, is stored in the electric fuse 11.

The test described above may be performed, not only for the delay time of the signal input/output into/from the RAM 6, but also for another path for which the delay time is defined as a performance requirement, and a critical path if such a path is specified. Alternatively, a power supply voltage VDD that satisfies any of performance requirements of a plurality of paths may be determined. For a path through which a signal propagates bidirectionally, such as the path for signals input/output into/from the RAM 6, the delay time of propagation in each direction may be tested as required. The paths subjected to the test are not limited to those through which signals actually propagate during use of the system LSI 1, but a path dedicated to testing may be provided according to the testing precision and the like, and the delay time of such a path may be tested. Also, the delay time may not be directly tested, but whether the system LSI 1 is operating properly may be determined.

As described in the first embodiment, the test may be performed in a packaged state, in a mounted state on a predetermined printed wiring board and the like, at various temperatures, and the like.

(Operation of System LSI 1 During Use)

As in the first embodiment, the electronic equipment system having the system LSI 1 in which power supply voltage information is stored in the electric fuse 11 operates as follows at its power-up, for example. The readout section 61 of the regulator 5 reads the power supply voltage information stored in the electric fuse 11 of the system LSI 1, and outputs the voltage adjustment signal to the voltage adjustment section 64. The voltage adjustment section 64 generates a voltage according to the voltage adjustment signal and outputs the generated voltage to the system LSI 1.

Therefore, the system LSI 1 operates properly at a required operating speed, and yet the power consumption can be suppressed from increasing. In particular, for example, the lower the absolute value |Vt| of the threshold Vt is due to fabrication variations, the larger the leakage current and the power consumption become. In such a case, the power supply voltage VDD may be adjusted to a low value within the range in which proper operation is ensured, thereby to reduce the power consumption. Also, the higher the absolute value |Vt| of the threshold Vt is, the longer the delay time tends to become. In such a case, the power supply voltage VDD may be adjusted to a high value to ensure proper operation. Thus, using the electronic equipment system as described above for mobile equipment such as cellular phones and PDAs, the life of batteries can be improved easily.

Fourth Embodiment

Although the control based on information stored in the electric fuse 11 was performed only by the controller 3 or the regulator 5 placed outside the LSI in the above embodiments, various controls may also be performed inside the LSI.

Figure 12:
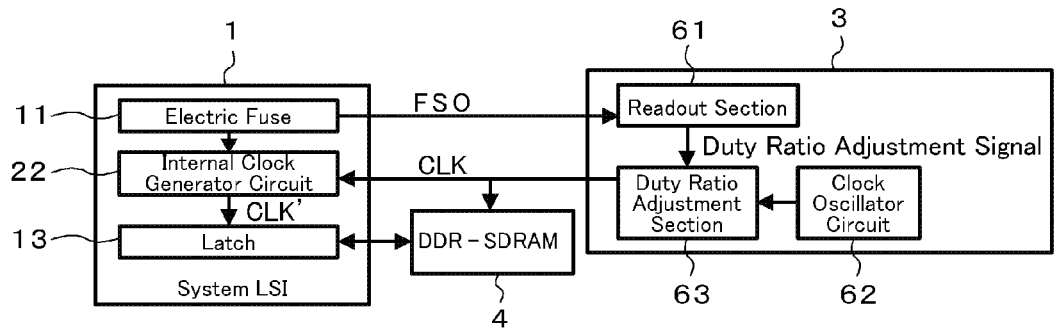
FIG. 12 is a block diagram of an electronic equipment system of the fourth embodiment.
Figure 13:
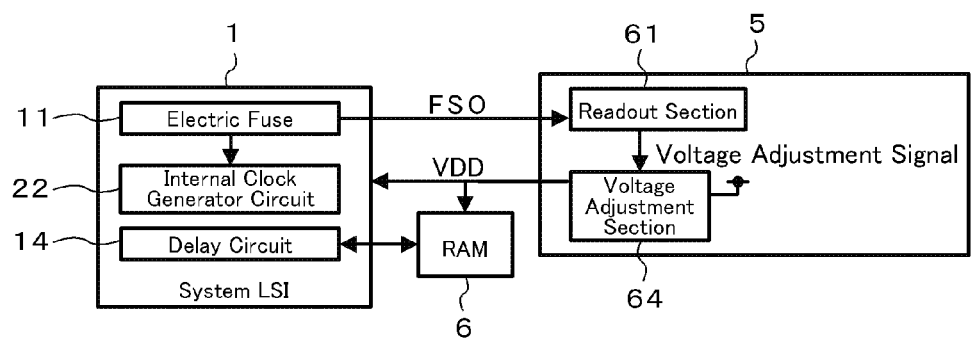
FIG. 13 is a block diagram of another electronic equipment system of the fourth embodiment.

More specifically, as shown in FIGS. 12 and 13, for example, control information stored in the electric fuse 11 is supplied to an internal clock generator circuit 22, for example, in addition to be read by the controller 3 or the regulator 5 for adjustment of the duty ratio of the clock signal CLK or the power supply voltage VDD supplied to the system LSI 1 and the like as in the first or third embodiment. Based on the control information, the internal clock generator circuit 22 switches delay circuits for edges of the clock signal CLK or the like, to adjust circuit characteristics thereby performing adjustment of phase (of rising edges and/or falling edges, for example). In this way, by achieving higher-precision phase adjustment of the clock signal, the reliability of data transfer can be further improved with respect to the operation of the DDR-SDRAM interface portion.

The control based on control information stored in the electric fuse 11 is not limited to that described above, but various types of adjustment and control may be performed for the input capacitance, the skew, the refresh period, the word formation setting, and the like as described in Patent Document 1, for example.

As described above, having both types of controls inside and outside the LSI, it is possible to perform a control allowed only from outside the LSI and a control that is more advantageous in the aspects of hardware scale, precision, and the like when being performed from outside than inside, and also perform a control allowed only inside the LSI and a control that is more advantageous when being performed inside than from outside.

Fifth Embodiment

The fifth embodiment of the present invention will be described hereinafter with reference to the relevant drawings.

Figure 14:
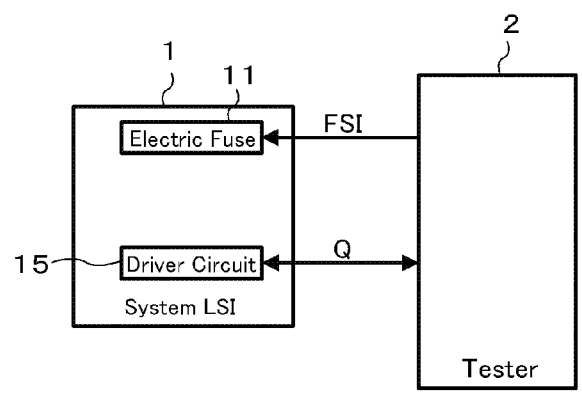
FIG. 14 is a block diagram showing a way of testing a system LSI 1 used in an electronic equipment system of the fifth embodiment.
Figure 15:
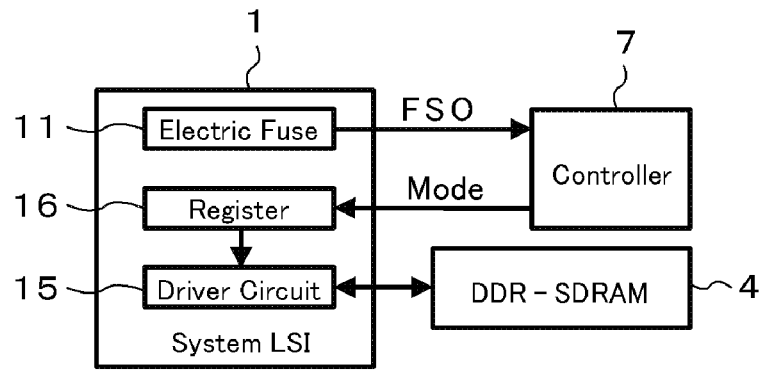
FIG. 15 is a block diagram of the electronic equipment system of the fifth embodiment.

FIG. 14 shows an example of a test performed during fabrication of a system LSI 1, for example, constituting an electronic equipment system of the fifth embodiment. Referring to FIG. 14, a tester 2 is connected to the system LSI 1, which includes an electric fuse 11 built therein and a data output driver circuit 15. FIG. 15 shows an electronic equipment system for output driver adjustment using the system LSI 1 described above, which includes a DDR-SDRAM 4 and a controller 7 for controlling the system LSI 1. A register 16 is built in the system LSI 1.

The operation of the electronic equipment system of this embodiment will be described. In an electronic equipment system, wrong transfer of data (Q) may occur in bus connection between the system LSI 1 and the memory (DDR-SDRAM 4), in particular, due to reflections caused by a mismatch of impedance. This especially applies in high-speed data transfer, and the optimum value of impedance differs among individual electronic equipment systems. In view of this, in the circuit configuration of this embodiment, the output impedance of the output driver circuit 15 of the system LSI 1 can be variably adjusted. In the testing process of the system LSI 1, the output current of the output driver circuit 15 varying due to fabrication variations is measured thereby to measure the output impedance, and information on the individual difference due to variations is recorded in the electric fuse 11 of the system LSI 1.

Figure 16:
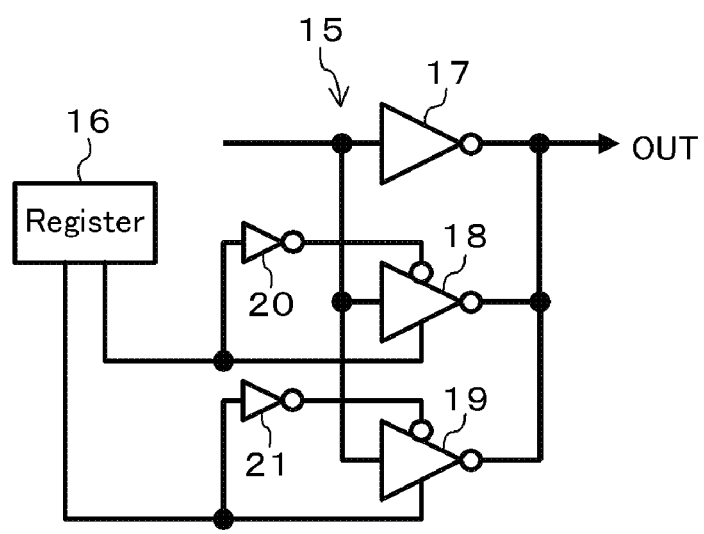
FIG. 16 is a circuit diagram showing an example of a circuit for adjusting output impedance as part of an output driver circuit 15 in the electronic equipment system of the fifth embodiment.

Thereafter, at power-up of the electronic equipment system having the system LSI 1 mounted therein, the output impedance information of the output driver circuit 15 recorded in the electric fuse 11 is read by the controller 7 (FSO). Mode signal is transferred from the controller to the register 16 of the system LSI 1 so that optimum output impedance is obtained, thereby to adjust the output driver size. FIG. 16 shows an example of a circuit for adjusting the output impedance as part of the output driver circuit 15. The output driver circuit 15 includes inverter circuits 17, 20, and 21 and clocked inverter circuits 18 and 19. The output impedance of the output driver circuit 15 is changed with the change in the size of the output buffer based on the signal from the register 16. In this way, it is possible to attain optimum output impedance against fabrication variations of the system LSI 1 on the electronic equipment system, and thus an optimum memory bus interface can be implemented for each individual electronic equipment system.

(Other Particulars)

The components described in the above embodiments and variations may be combined in various ways as far as such combinations are logically permitted. For example, in addition to adjustment of the duty ratio of the clock signal CLK as described in the first embodiment, the power supply voltage may be adjusted as described in the third embodiment. The configuration of adjustment according to information recorded in a plurality of LSIs as described in the second embodiment may be applied to adjustment of the power supply voltage as described in the third embodiment. In this case, independent power supply voltages may be supplied to the individual LSIs.

The signal to be adjusted is not limited to the duty ratio of the clock signal as described above, but electric characteristics of various signals supplied to the LSI may be adjusted. In other words, the adjustment of the duty ratio of the clock signal is an example of edge timing adjustment. As another example, adjustment of timing of all edges, or adjustment of the phase of the clock signal, may be performed. This facilitates matching of the phase of the clock signal with the timing of other data signals, control signals, and the like. Otherwise, the frequency of the clock signal may be adjusted, or the timing of various control signals other than the clock signal may be adjusted.

The voltage to be adjusted is not limited to the power supply voltage, but bias voltages including the substrate bias voltage supplied to the LSI and various reference voltages, for example, may be adjusted.

Also, the signal or the voltage to be adjusted is not limited to that directly supplied to the first LSI in which information on a characteristic is stored, but a signal or a voltage supplied to a second LSI that operates in coordination with the first LSI may be adjusted. For example, a predetermined clock signal may be input into the second LSI, and the clock signal, or a strobe signal or the like corresponding to the clock signal, may be input into the first LSI together with a data signal, or any signal synchronizing with the clock signal may be input into the first LSI. In such a case, by adjusting the clock signal input into the second LSI, the signal input into the first LSI will be adjusted indirectly. Thus, a similar effect can also be obtained.

According to the present invention, an appropriate signal or voltage allowing for variations during fabrication of a semiconductor integrated circuit is supplied to the semiconductor integrated circuit. This makes it possible to enhance the reliability of the semiconductor integrated circuit and reduce the power consumption easily while suppressing increase in the circuit scale of the semiconductor integrated circuit, for example. Thus, the present invention is useful as an electronic equipment system having an LSI such as a system LSI (semiconductor integrated circuit), and more particularly as an electric equipment system in which adjustment against LSI fabrication variations is possible, for example.

What is claimed is:

1. An electronic equipment system, comprising:
a semiconductor integrated circuit having a nonvolatile memory storing information on a characteristic of the semiconductor integrated circuit; and
a controller configured to control the semiconductor integrated circuit,
wherein the controller has a function of adjusting an access parameter to the semiconductor integrated circuit based on the information stored in the nonvolatile memory;
the function of the controller of adjusting an access parameter to the semiconductor integrated circuit is a function of adjusting an electric characteristic of a signal or a voltage supplied to the semiconductor integrated circuit or another semiconductor integrated circuit operating in coordination with the semiconductor integrated circuit based on the information stored in the nonvolatile memory; and
the signal supplied to the semiconductor integrated circuit or the another semiconductor integrated circuit is a clock signal or a timing control signal, and the electric characteristic is at least one of the edge timing, duty ratio, phase, and frequency of the clock signal or the edge timing of the timing control signal.

2. The electronic equipment system of claim 1, wherein the clock signal is a clock signal supplied to the semiconductor integrated circuit for controlling transmission or reception of data in the semiconductor integrated circuit.

3. The electronic equipment system of claim 1, wherein the clock signal is a clock signal supplied to the another semiconductor integrated circuit for controlling transmission or reception of data to or from the semiconductor integrated circuit.

4. The electronic equipment system of claim 1, wherein the voltage supplied to the semiconductor integrated circuit is at least one of a power supply voltage, a bias voltage, and a reference voltage, and the electric characteristic is a voltage value of the power supply voltage, the bias voltage, or the reference voltage.

5. An electronic equipment system, comprising:
a semiconductor integrated circuit having a nonvolatile memory storing information on a characteristic of the semiconductor integrated circuit; and
a controller configured to control the semiconductor integrated circuit,
wherein the controller has a function of adjusting an access parameter to the semiconductor integrated circuit based on the information stored in the nonvolatile memory;
the function of the controller of adjusting an access parameter to the semiconductor integrated circuit is a function of adjusting an electric characteristic of a signal or a voltage supplied to the semiconductor integrated circuit or another semiconductor integrated circuit operating in coordination with the semiconductor integrated circuit based on the information stored in the nonvolatile memory; and
the electric characteristic is a voltage value of a power supply voltage with which the delay time in a predetermined signal path in operation of the semiconductor integrated circuit is equal to or less than a predetermined value.

6. The electronic equipment system of claim 1, wherein the semiconductor integrated circuit is a system LSI including a plurality of logic circuit modules.

7. The electronic equipment system of claim 1, wherein the semiconductor integrated circuit is a memory.

8. The electronic equipment system of claim 7, wherein the semiconductor integrated circuit is a double data rate synchronous dynamic random access memory.

9. The electronic equipment system of claim 1, wherein the nonvolatile memory is constructed of at least one of a fuse and an antifuse.

10. The electronic equipment system of claim 1, wherein the semiconductor integrated circuit is constructed so that a circuit characteristic is adjusted based on the information stored in the nonvolatile memory.

11. The electronic equipment system of claim 1, wherein the information stored in the nonvolatile memory is information indicating at least one of the optimum value, upper-limit value, lower-limit value, and upper/lower-limit values of the access parameter.

12. The electronic equipment system of claim 1, wherein the information stored in the nonvolatile memory is information detected by a test of the semiconductor integrated circuit.

13. The electronic equipment system of claim 12, wherein the test of the semiconductor integrated circuit is performed in a packaged state of the semiconductor integrated circuit.

14. The electronic equipment system of claim 12, wherein the test of the semiconductor integrated circuit is performed in a mounted state of the semiconductor integrated circuit on a predetermined wiring board.

15. The electronic equipment system of claim 12, wherein the test of the semiconductor integrated circuit is performed at a temperature higher than the maximum use temperature defined as a specification condition of the semiconductor integrated circuit.

16. The electronic equipment system of claim 1, wherein the access parameter is related to output impedance of a driver circuit provided in the semiconductor integrated circuit.

* * * * *